(12) United States Patent
Gao

(10) Patent No.: US 12,010,815 B2
(45) Date of Patent: Jun. 11, 2024

(54) CHIP TO SERVER PACKAGING DESIGN FOR IMMERSION SYSTEMS

(71) Applicant: Baidu USA LLC, Sunnyvale, CA (US)

(72) Inventor: Tianyi Gao, San Jose, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 279 days.

(21) Appl. No.: 17/698,854

(22) Filed: Mar. 18, 2022

(65) Prior Publication Data
US 2023/0301020 A1 Sep. 21, 2023

(51) Int. Cl.
*H05K 7/20* (2006.01)

(52) U.S. Cl.
CPC ..... *H05K 7/20272* (2013.01); *H05K 7/20236* (2013.01); *H05K 7/20809* (2013.01)

(58) Field of Classification Search
CPC ... H01L 23/4735; H01L 23/34; H01L 23/473; H01L 23/4336; F28D 15/0266; F28D 2021/0028; H05K 7/20772; H05K 7/20809; H05K 7/20254; H05K 7/20272; H05K 7/20345; H05K 7/20509; H05K 7/20763
USPC .................................................. 361/679.53
See application file for complete search history.

(56) References Cited

U.S. PATENT DOCUMENTS

| | | | | |
|---|---|---|---|---|
| 5,349,831 A | * | 9/1994 | Daikoku | H01L 23/427 165/80.4 |
| 5,436,501 A | * | 7/1995 | Ikeda | H01L 23/4735 165/80.4 |
| 6,498,725 B2 | * | 12/2002 | Cole | F25B 39/028 165/104.31 |
| 7,450,378 B2 | * | 11/2008 | Nelson | H01L 23/4735 361/689 |
| 7,477,513 B1 | * | 1/2009 | Cader | H01L 23/4735 257/714 |
| 7,511,957 B2 | * | 3/2009 | Campbell | H01L 23/4735 257/714 |
| 9,257,365 B2 | * | 2/2016 | Joshi | H01L 23/4336 |
| 2010/0053889 A1 | * | 3/2010 | Miller | H01L 23/4735 361/689 |
| 2020/0124337 A1 | * | 4/2020 | Tokeshi | F25D 19/00 |
| 2023/0320029 A1 | * | 10/2023 | Kanai | H05K 7/20136 361/679.47 |

* cited by examiner

*Primary Examiner* — Mandeep S Buttar
(74) *Attorney, Agent, or Firm* — WOMBLE BOND DICKINSON (US) LLP

(57) ABSTRACT

A cooling module includes a first cooling plate having a first internal channel and a second cooling plate having a second internal channel. The cooling module includes an interconnect frame coupled in between the first and second cooling plates, the interconnect frame includes a third internal channel that connects the first internal channel to the second internal channel. The cooling module includes a first injection plate attached to a bottom portion of the first cooling plate and a second injection plate attached to a bottom portion of the second cooling plate, the first and second injection plates manage a distribution of coolant fluid to dedicated areas of electronic chips adjacent to the first and second injection plates. The cooling module includes a first pump frame coupled to an inlet port at the first cooling plate, a first pump disposed at the first pump frame to directly intake a coolant fluid.

20 Claims, 8 Drawing Sheets

CHIP TO SERVER PACKAGING DESIGN FOR IMMERSION SYSTEMS

FIELD OF THE INVENTION

Embodiments of the present invention relate generally to data center and energy storage system cooling. More particularly, embodiments of the invention relate chip to server packaging design for immersion systems.

BACKGROUND

Thermal management for a data center that includes several active electronic racks is critical to ensure proper performance of servers and/or other IT equipment (e.g., performing IT services) that is operating in the racks. Without proper thermal management, however, the thermal environment (e.g., temperature) within the racks may exceed thermal operational thresholds, which may result in adverse consequences (e.g., servers failing, etc.). One way to manage the thermal environment is the use of cooling air to cool the IT equipment. The cooling air is recirculated through cooling units. Heat generated by the IT equipment is captured by the cooling air and is extracted by the cooling unit.

Recently, data centers have been deploying high-power density electronic racks, where a large quantity of high-density chips are packaged closer together to provide more computing power. Cooling these high-density racks by maintaining a proper thermal environment may be an issue with existing cooling systems, such as a computer room air conditioning (CRAC) unit. For instance, although the CRAC unit may maintain the thermal environment with more conventional (or lower-density) racks, the unit may be unable to effectively cool high-power density racks because they may generate heat load at a higher rate due to the higher density electronics. Or significant cost may be needed for upgrading a CRAC system to satisfy a cooling requirement of a high density deployment. Another challenge for air cooling high density racks is moving a large amount of airflow sufficient to cool the racks. Since heat removal capacity of fluid is much larger than heat removal capacity of air, thus it is more economical to move cooling fluid for cooling. Therefore, designing the cooling fluid closer to the IT, indirectly or directly in contact with electronics are an effective mean.

Immersion cooling, which involves at least partially submerging electronics in a non-conductive dielectric solution, is a feasible solution for high-density electronics. Existing solutions for immersion cooling only considers fluid recirculation for an electronic rack without local cooling acceleration. Heterogeneous electronic components that can give rise to predictable hot spots with immersion cooling. Therefore, there is a need for local cooling acceleration to accommodate hot spots for different electronic hardware, chips, and configurations.

BRIEF DESCRIPTION OF THE DRAWINGS

Embodiments of the invention are illustrated by way of example and not limitation in the figures of the accompanying drawings in which like references indicate similar elements.

DETAILED DESCRIPTION

Figure 1:
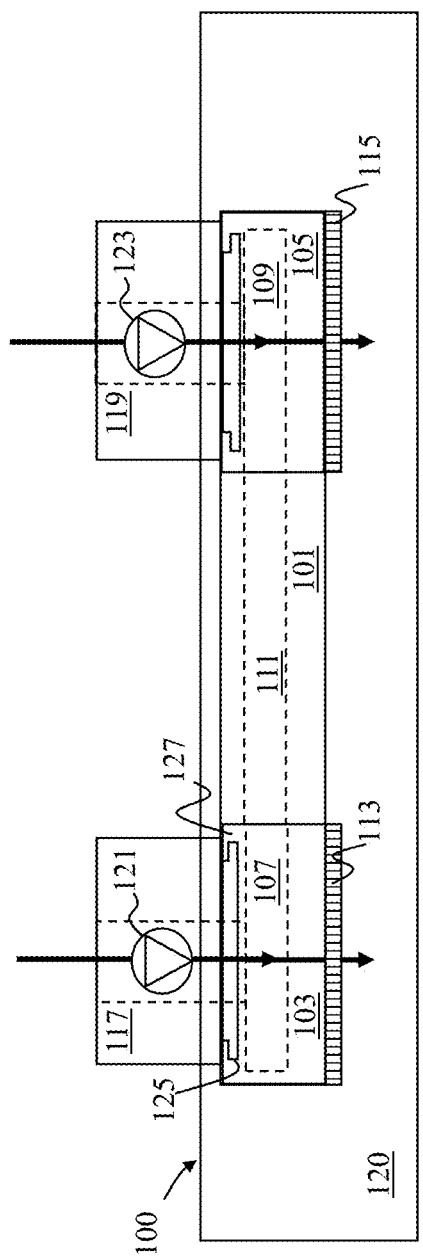
FIG. 1 is a block diagram illustrating a cooling module according to one embodiment.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment. Reference in the specification to "substantial" or "substantially" or "approximately" means that a particular feature, structure, or characteristic described in conjunction with the embodiment is within 10% of the target.

High power density electronic chips have thermal requirement at varying locations on the chips that give rise to what is termed as on-chip hot spots. On-chip hot spots, which are areas of elevated temperature that occur on the chip level, have intense adverse effects on electronic device performance. Existing solutions to cool high power density chips uses high performance heat sinks that are indiscriminately placed on top of the chips. These solutions do not solve the hot spot challenge efficiently or effectively.

Embodiments disclose a cooling system for high power density chips using single phase immersion coolant. The cooling system includes a cooling plate that includes an intermediate plate where coolant fluid is being distributed directly to the surface of the electronic chips. The intermediate plate is configured to distribute fluid or managing the fluid to the dedicated areas (e.g., hot spots) of the chips. Coolant fluid can be a mineral oil, dielectric solution, glycol, and so forth.

According to a first aspect, a cooling module includes a first cooling plate having a first internal channel and a second cooling plate having a second internal channel. The cooling module includes an interconnect frame coupled in between the first and second cooling plates, the interconnect frame includes a third internal channel that connects the first internal channel to the second internal channel. The cooling module includes a first injection plate attached to a bottom portion of the first cooling plate and a second injection plate attached to a bottom portion of the second cooling plate, the first and second injection plates manages a distribution of coolant fluid to dedicated areas of electronic chips adjacent to the corresponding first and second injection plates. The cooling module includes a first pump frame coupled to an inlet port at the first cooling plate, a first pump disposed at the first pump frame to directly intake a coolant fluid from the first pump to the first internal channel of the first cooling plate, wherein the coolant fluid at the first internal channel enters the second internal channel from the third internal channel and the coolant fluid is accelerated by the first and second injection plates to the dedicated areas of the electronic chips and the coolant fluid merges with an immersion fluid, and a mounting structure secured to the first and second cooling plates, where the mounting structure is mounted to a server chassis to position the first and second injection plates near the dedicated areas of the electronic chips.

In one embodiment, the cooling module further includes a second pump frame coupled to an inlet port at the second cooling plate and a second pump disposed at the second pump frame to pump a same coolant fluid from the second pump to the second internal channel of the second cooling plate, where the first and/or second pumps operate in redundant mode.

In one embodiment, the second cooling plate is arranged in a series manner or a parallel manner with the first cooling plate and coolant fluid enters the first internal channel subsequent to entering the second internal channel.

In one embodiment, the first pump generates a localized acceleration of cooling stream within an immersion environment.

In one embodiment, the first pump is situated to a side of the first cooling plate or the first pump is situated near a top portion of the first cooling plate.

In one embodiment, the first or second injection plates include a number of injection ports or plates forming an injection pattern that injects coolant fluid at locations with flow rates based on locations and sizes of the injection ports.

In one embodiment, the first or second injection plates are configured nearby a first subset of electronics with workload intensity above a threshold but not near a second subset of electronics with workload intensity below a threshold.

In one embodiment, the first pump frame is open-ended to the immersion fluid to directly receive the immersion fluid as the coolant fluid or the first pump frame is coupled to a distribution line to receive the coolant fluid that is different from the immersion fluid.

In one embodiment, when the first pump frame is coupled to the distribution line to receive the coolant fluid that is different from the immersion fluid, the distribution line includes a distribution pump to distribute coolant fluid to the first pump frame.

According to a second aspect, a server includes a chassis frame housing a server board having a number of electronic chips that are submersible in an immersion environment, a perforation region at an end of the server for an immersion fluid to enter or exit the immersion environment, and a cooling module contained within the chassis frame. The cooling module includes a first cooling plate having a first internal channel and a second cooling plate having a second internal channel. The cooling module includes an interconnect frame coupled in between the first and second cooling plates, the interconnect frame includes a third internal channel that connects the first internal channel to the second internal channel. The cooling module includes a first injection plate attached to a bottom portion of the first cooling plate and a second injection plate attached to a bottom portion of the second cooling plate, the first and second injection plates manages a distribution of coolant fluid to dedicated areas of electronic chips adjacent to the corresponding first and second injection plates. The cooling module includes a first pump frame coupled to an inlet port at the first cooling plate, a first pump disposed at the first pump frame to directly intake a coolant fluid from the first pump to the first internal channel of the first cooling plate, wherein the coolant fluid at the first internal channel enters the second internal channel from the third internal channel and the coolant fluid is accelerated by the first and second injection plates to the dedicated areas of the electronic chips and the coolant fluid merges with an immersion fluid, and a mounting structure secured to the first and second cooling plates, where the mounting structure is mounted to the chassis frame to position the first and second injection plates near the dedicated areas of the electronic chips.

According to a third aspect, a cooling system includes an immersion unit, and a server submersible in the immersion unit. The server includes a chassis frame housing a server board having a number of electronic chips that are submersible in an immersion environment, a perforation region at an end of a server chassis for an immersion fluid to enter or exit the immersion environment, and a cooling module contained within the chassis frame. The cooling module includes a first cooling plate having a first internal channel and a second cooling plate having a second internal channel. The cooling module includes an interconnect frame coupled in between the first and second cooling plates, the interconnect frame includes a third internal channel that connects the first internal channel to the second internal channel. The cooling module includes a first injection plate attached to a bottom portion of the first cooling plate and a second injection plate attached to a bottom portion of the second cooling plate, the first and second injection plates manages a distribution of coolant fluid to dedicated areas of electronic chips adjacent to the corresponding first and second injection plates. The cooling module includes a first pump frame coupled to an inlet port at the first cooling plate, a first pump disposed at the first pump frame to directly intake a coolant fluid from the first pump to the first internal channel of the first cooling plate, wherein the coolant fluid at the first internal channel enters the second internal channel from the third internal channel and the coolant fluid is accelerated by the first and second injection plates to the dedicated areas of the electronic chips and the coolant fluid merges with an immersion fluid, and a mounting structure secured to the first and second cooling plates, where the mounting structure is mounted to the chassis frame to position the first and second injection plates near the dedicated areas of the electronic chips.

FIG. 1 is a block diagram illustrating a cooling module 100 according to one embodiment. Cooling module 100 can be considered as a server-based cooling packaging that is attached to a server chassis. In one embodiment, cooling module 100 includes cooling plates 103-105 spaced apart at dedicated cooling areas. A top portion of each of cooling plates 103-105 has an opening that are coupled to respective pump frames 117-119. Pump frames 117-119 can be used as a structural support for a pump connection to be connected to respective cooling plates 103-105. In one embodiment, pumps 121-123 can be packaged to respective pump frames 117-119 on top of respective cooling plates 103-105. Additionally, each of pumps 121-123 can have an open-ended suction side (or open port) and a connection side to respective cooling plates 103-105. The suction side is exposed to an ambient such as an immersion environment and can intake a coolant fluid from the immersion environment. In another embodiment, pumps 121-123 are connected to a fluid loop and coolant fluid is provided to pumps 121-123 by the fluid loop, as further detailed in FIG. 8.

In one embodiment, each of cooling plates 103-105 have respective internal channels 107 and 109 (shown as dashed lines) to receive a coolant fluid from pumps 121-123. In one embodiment, cooling plates 103-105 is interconnected with an interconnecting frame 101 and interconnecting frame 101 has an interconnect channel 111 (shown as dashed lines). Interconnect channel 111 can fluidly couple internal channel 107 to internal channel 109 for fluid distribution between the two cooling plates 103-105. Such a redundant design allows either of pumps 121-123 to provide fluid to both cooling plates 103-105. For example, if pump 121 is faulty or is removed for maintenance, pump 123 can provide fluid to both cooling plates 103-105 via interconnect channel 111. Thus, pumps 121-123 can operate in a redundant mode in a redundant fashion in this design.

In one embodiment, cooling module 100 includes a chassis panel 120 with a number of cooling plate slots for cooling plates to fit in. Cooling plates 103-105 can be secured to chassis panel 120 via locking mechanism 125-127. Chassis panel 120 can be secured to a server chassis, as further shown in FIG. 3. In one embodiment, chassis panel 120 can be secured in between cooling plates 103-105 and pump frames 117-119, when cooling plates 103-105 are locked to pump frames 117-119. For example, cooling plates 103-105 and pump frames 117-119 can include locking mechanism 125-127. Cooling plates 103-105 can include receiving brackets 127, and pump frames 117-119 can include complementary extension brackets 125. In one embodiment, extension brackets 125 is insertable in receiving brackets 127 at horizontal alignment. Once inserted at receiving brackets 127, extension brackets 125 can be twisted to a vertical alignment to lock with the receiving brackets 127. Once locking mechanism 125-127 is locked, pump frames 117-119 is secured to respective cooling plates 103-105. Having chassis panel 120 sandwiched in between pump frames 117-119 and cooling plates 103-105, thus, chassis panel 120 is locked in between. Note that the cooling plates 103-105 can be connected to interconnecting frame 101 via a similar locking mechanism. In another embodiment, interconnecting frame 101 is machined with cooling plates 103-105 as a single piece.

In one embodiment, cooling plates 103-105 are attached with injection plates 113-115 of various sizes that is printed with various injection nozzle (holes) patterns (e.g., size, placement, direction, etc.). Coolant fluid in internal channels of cooling plates can be pressurized in the internal/interconnect channels and coolant fluid can be directed through the injection patterns of injection plates 113-115. Coolant fluid can then exit the injection patterns as a jet of coolant fluid aimed at a surface of high power density electronics/chips.

In one embodiment, chassis frames of various sizes with different number of cooling plate slots, at various locations can be used according to the server board and server chassis configurations. This way, cooling module 100 can be assembled directly to server board and/or server chassis of any form factor, with high density chips at any locations.

Figure 2:
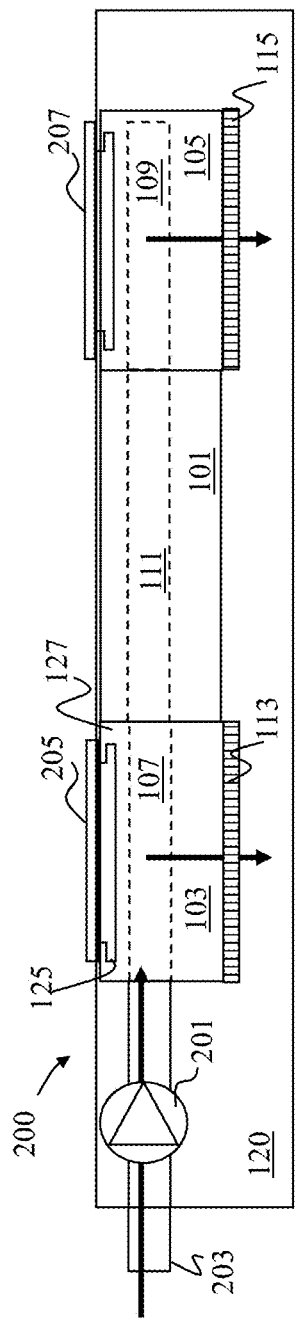
FIG. 2 is a block diagram illustrating a cooling module according to another embodiment.

FIG. 2 is a block diagram illustrating a cooling module according to another embodiment. Cooling module 200 can represent cooling module 100 of FIG. 1. As shown in FIG. 2, cooling plate 107 is modified with open port 203 placement to a side of cooling plate 103 and pump 201 is packaged to the placement side for direct intake of coolant fluid. Cooling plates 103 and 105 can be secured to chassis panel 120 via locking mechanism 125-127 using caps 205 and 207. Here, caps 205 and 207 can be sealed panels used for the purpose of securing cooling plates 107-109 to chassis panel 120. In one embodiment, open port 203 is an open-ended suction side that intakes a coolant fluid from an immersion environment directly.

Representative of cooling module 100, open port 203 of cooling module 200 can receive a coolant fluid from a fluid loop line. The two cooling plates 103-105 can have interconnect channel 111 interconnecting their respective internal channels 107-109 and the internal channels 107-109 can be arranged in a series manner, where coolant fluid enters channel 107, follow by channel 111, follow by channel 109.

In one embodiment, internal channel 111 can be attached directly to pump 201. In this case, internal channels 107-109 can be arranged in parallel manner, where coolant fluid enters channel 107, in parallel with entering channels 111 and channel 109.

Figure 3:
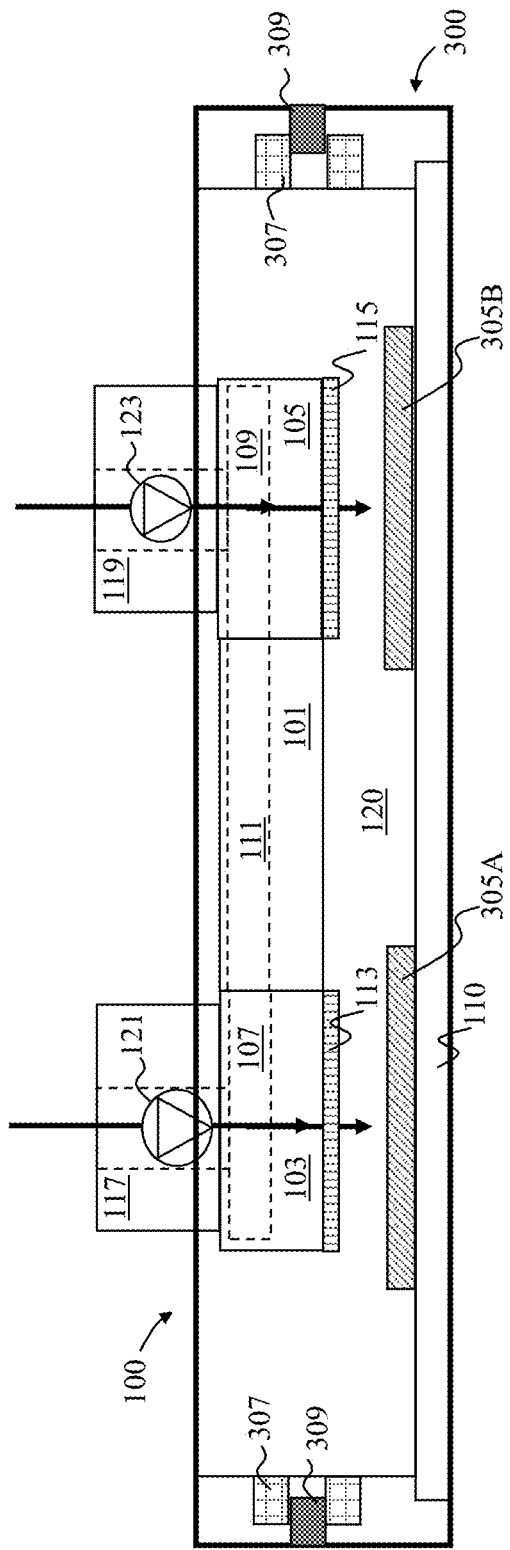
FIG. 3 is a block diagram illustrating a side view of a cooling module assembled to a server chassis according to one embodiment.

FIG. 3 is a block diagram illustrating a side view of a cooling module 100 assembled to a server chassis 300 according to one embodiment. Server chassis 300 can include server board 110 with electronics disposed on the server board 110. The electronics can include high density electronic chips 305A-305B that has hot spots. Chassis panel 120 can include mounting structures (e.g., studs/ protrusions) 307 at two distal ends. Studs 307 can slide into protrusion 309 of server chassis 300 to secure chassis panel 120 to server chassis 300.

In one embodiment, server board 110 can be part of a server of a data center can be configured to provide IT services. Specifically, servers of the data center may include a host server (referred to as a host node) and/or one or more compute servers (also referred to as computing nodes, such as CPU server and GPU server). The host server (having one or more CPUs) typically interfaces with clients (not shown) over a network (e.g., Internet) to receive a request for a particular service such as storage services (e.g., cloud-based storage services such as backup and/or restoration), executing an application to perform certain operations (e.g., image processing, deep data learning algorithms or modeling, etc., as a part of a software-as-a-service or SaaS platform). In response to the request, the host server distributes the tasks to one or more of the performance computing nodes or compute servers (having one or more GPUs) managed by the host server. In one embodiment, the servers can perform any type of computing task and/or can be any type of computing device (e.g., a server, a storage device, etc.) with various high power density components, such as memory modules, central/graphical processing units, accelerator units, etc. In one embodiment, the servers can be edge computing devices. Thus, while the servers provide the IT services, electronic components of the servers generate heat that forms hot spots on the electronic components.

Figure 4:
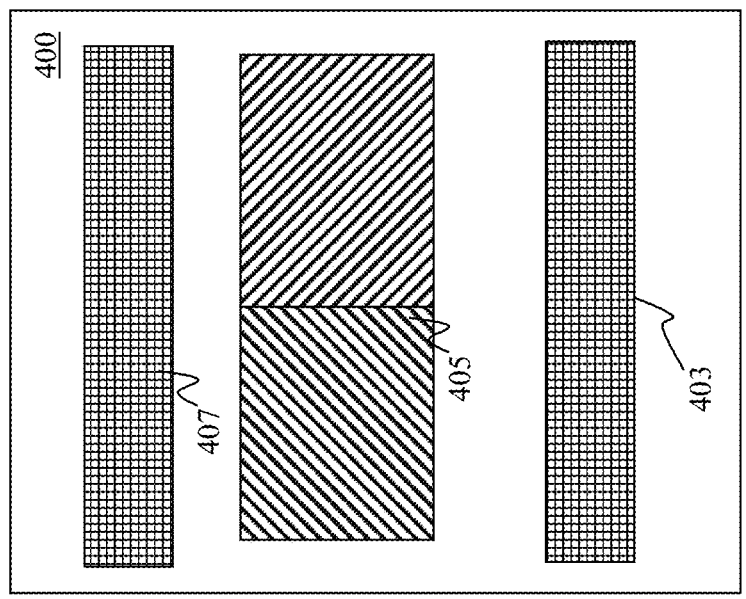
FIG. 4 is a block diagram illustrating a bottom view of an injection plate according to one embodiment.

FIG. 4 is a block diagram illustrating a bottom view of an injection plate 400 according to one embodiment. Injection plate 400 can represent injection plates 113-115 of FIGS. 1-3. Injection plate 400 can be attached to the bottom of cooling plates or can be machined as part of a cooling plate. As shown, injection plate 400 can be viewed as an injection layer with multiple injection ports of different sizes at different locations forming patterns that can correspond to a surface of electronic chips. For example, patterns 403, 405, 407 can be used for a single chip, or can be used for multiple electronic chips, such as, memory modules, processing unit, accelerator unit, etc. The different patterns can provide different cooling thresholds suitable for electronics with varying thermal demands (hot spots).

Figure 5:
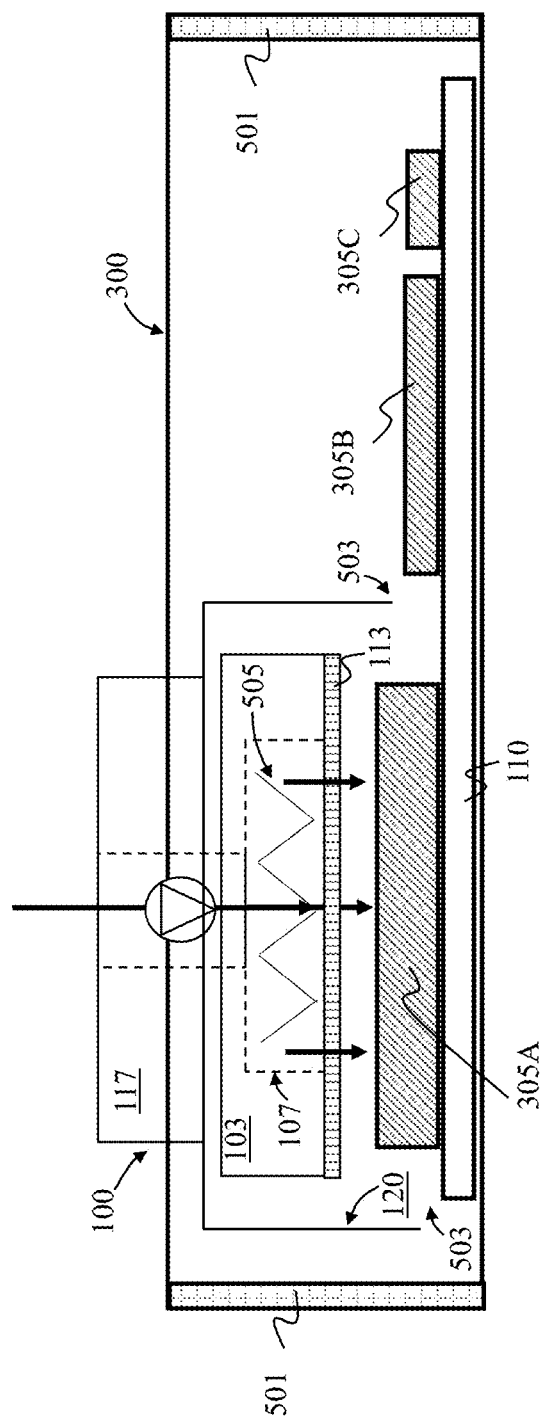
FIG. 5 is a block diagram illustrating another side view of a cooling module assembled to a server chassis according to one embodiment.

FIG. 5 is a block diagram illustrating another side view of a cooling module 100 assembled to a server chassis 300 according to one embodiment. As shown from a different side view, cooling module 100 is attached to server chassis 300 via chassis panel 120. In this embodiment, the injection plate 113 can be dedicated to chip 305A on server board 110. In one embodiment, chassis panel 120 can cover chip 305A while the other electronics 305B-305C are not covered by chassis panel 120. For example, chassis panel 120 can represent a box with an underside that is open covering portions of chip 305A. Chassis panel 120 is not sealed and coolant fluid can exit from chassis panel 120 from gaps 503 between chassis panel 120 and server board 110. In one embodiment, one or more sides of server chassis 300 includes perforations 501 for coolant fluid to exit from server chassis 300. In this design, the injection plate can be used to cool all or only a subset of chips or devices on a server board that have non-uniform power density distributions (e.g., hot spots). In one embodiment, cooling plate 100 can include a distributor structure 505 to distribute coolant fluid within cooling plate 100. Distributor structure 505 can prevent the coolant fluid from going straight from pump to injection plate. In one embodiment, distributor structure 505 is co-designed with internal channel 107. In one embodiment, distributor structure 505 is co-designed with injection plate 113. For example, injection plate 113 not only forms an injection pattern but can also function as a fluid distributor. In one embodiment, distributor structure 505, internal channel 107, together with injection plate 113 form a controlled fluid distribution pattern over the top of the electronics 305A.

Figure 6:
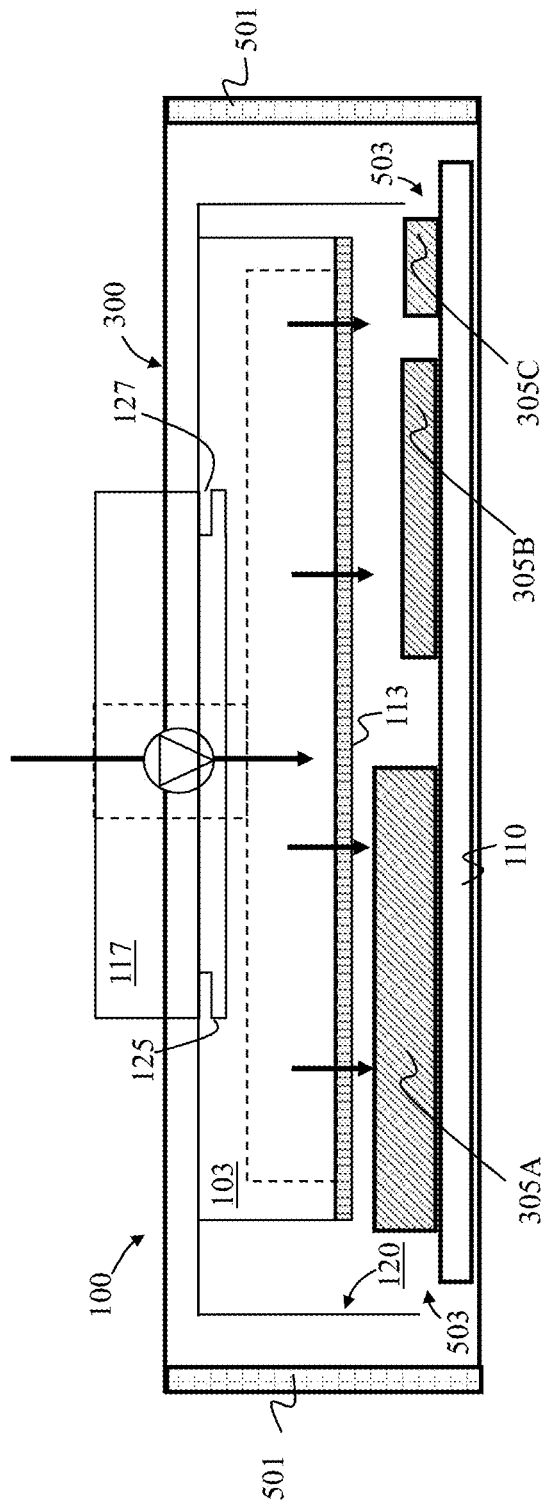
FIG. 6 is a block diagram illustrating a side view of a large cooling module with an injection plate to cool all high power density server electronics according to one embodiment.

FIG. 6 is a block diagram illustrating a side view of a large cooling module 100 with an injection plate to cool all high power density server electronics 305A-305B according to one embodiment. Cooling module 100/server chassis 300 of FIG. 6 can represent cooling module 100/server chassis 300 of FIG. 5. As described above, injection plate 113 and cooling plate 113 of cooling module 100 can be configured with varying sizes to match the thermal requirements of server electronics. In one embodiment, cooling module 100 can include a large cooling plate 103 that covers server board 110. The large cooling plate 103 can be attached with injection plate 113, where injection plate 113 is used to distribute fluid to multiple chips 305A-C of server board 110. Cooling plate 103 can be secured to chassis panel 120 via locking mechanism 125-127. In one embodiment, chassis panel 120 can be secured in between cooling plate 103 and pump frame 117, when cooling plate 103 is locked to pump frame 117. For example, cooling plate 103 can include receiving brackets 127, and pump frame 117 can include complementary extension brackets 125. In one embodiment, extension brackets 125 is insertable in receiving brackets 127 at horizontal alignment. Once inserted at receiving brackets 127, extension brackets 125 can be twisted to a vertical alignment to lock with the receiving brackets 127. Once locking mechanism 125-127 is locked, pump frame 117 can be secured to respective cooling plate 103 having chassis panel 120 sandwiched in between.

Figure 7:
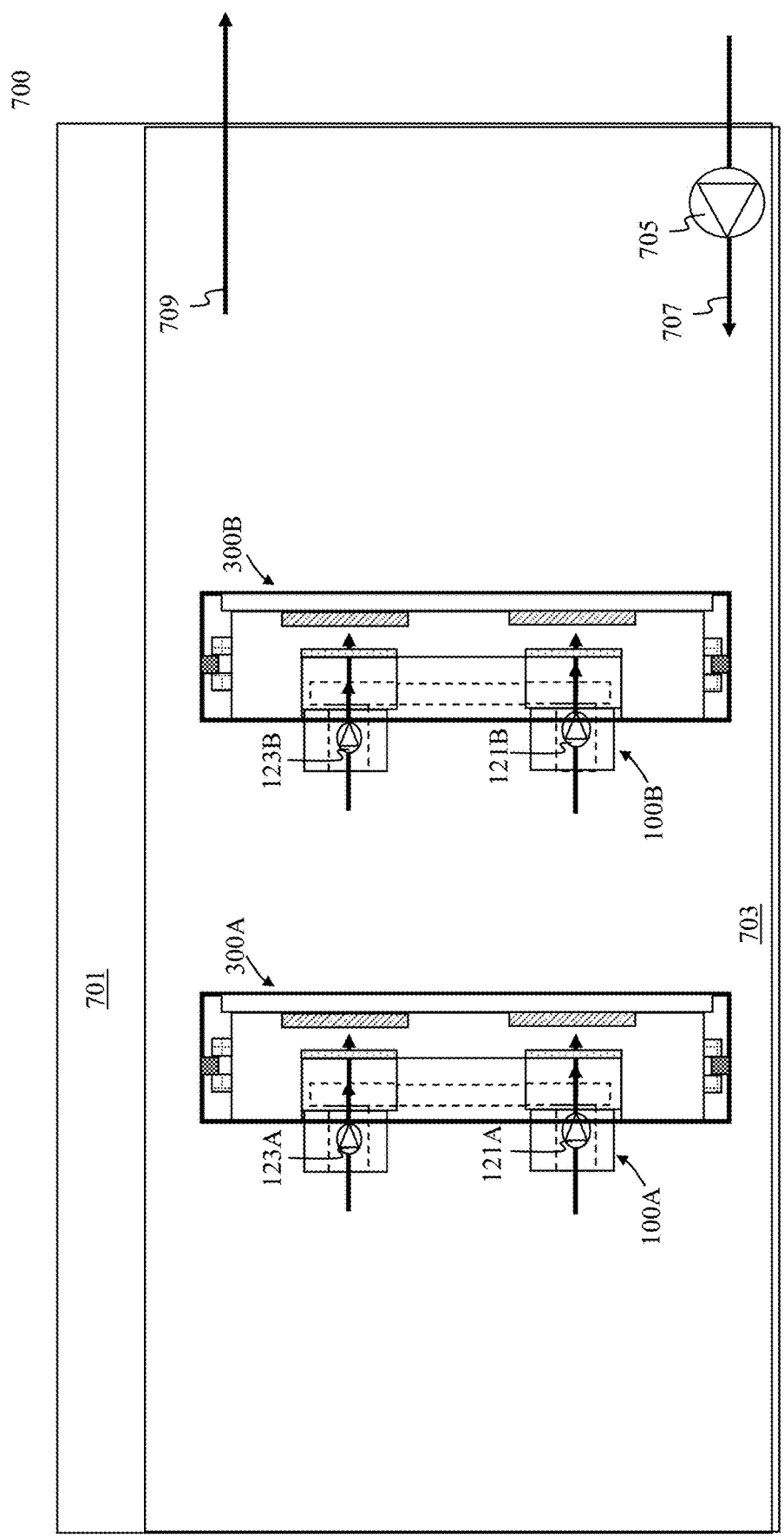
FIG. 7 is a block diagram illustrating a cooling system having cooling modules and servers submerged in an immersion environment according to one embodiment.

FIG. 7 is a block diagram illustrating a cooling system 700 having cooling modules 100A-100B in respective server chassis 300A-300B that are submerged in an immersion environment according to one embodiment. System 700 is designed having cooling modules 100A-100B and respective server chassis 300A-300B submerged in immersion unit 701. Immersion unit 701 can be an immersion tank that contains immersion fluid 703. In this setup, cooling modules 100A-100B can have the suction side of pumps 121A-123A, 121B-123B directly open to immersion fluid 703. Cooling system 700, thus, enables immersion fluid 703 to be directed by pumps of the cooling modules 100A-100B as jets of coolant fluid to the surfaces of high power density chips/electronics. At the same time, high power density chips/electronics of the server board are contained in server chassis 300A-300B and are submerged in immersion fluid 703. In one embodiment, jets of coolant fluid transfers heat from the high power density chips/electronics to the coolant fluid and the coolant fluid exits the server chassis via perforations of the server chassis, where the coolant fluid then merges with immersion fluid 703. Here, the coolant fluid can be a same fluid as immersion fluid 703. The overall immersion system can be recirculated by pump 705, which is coupled to an inlet port 707 as part of immersion unit 701. A corresponding outlet port 709 enables immersion fluid to exit immersion unit 701, e.g., excess immersion fluid, or when performing services and maintenance. Although each of cooling modules 100A-100B are shown with two, cooling modules 100A-100B can include any number of cooling plates/injection plates to cool all or a subset of chips of the server boards.

Figure 8:
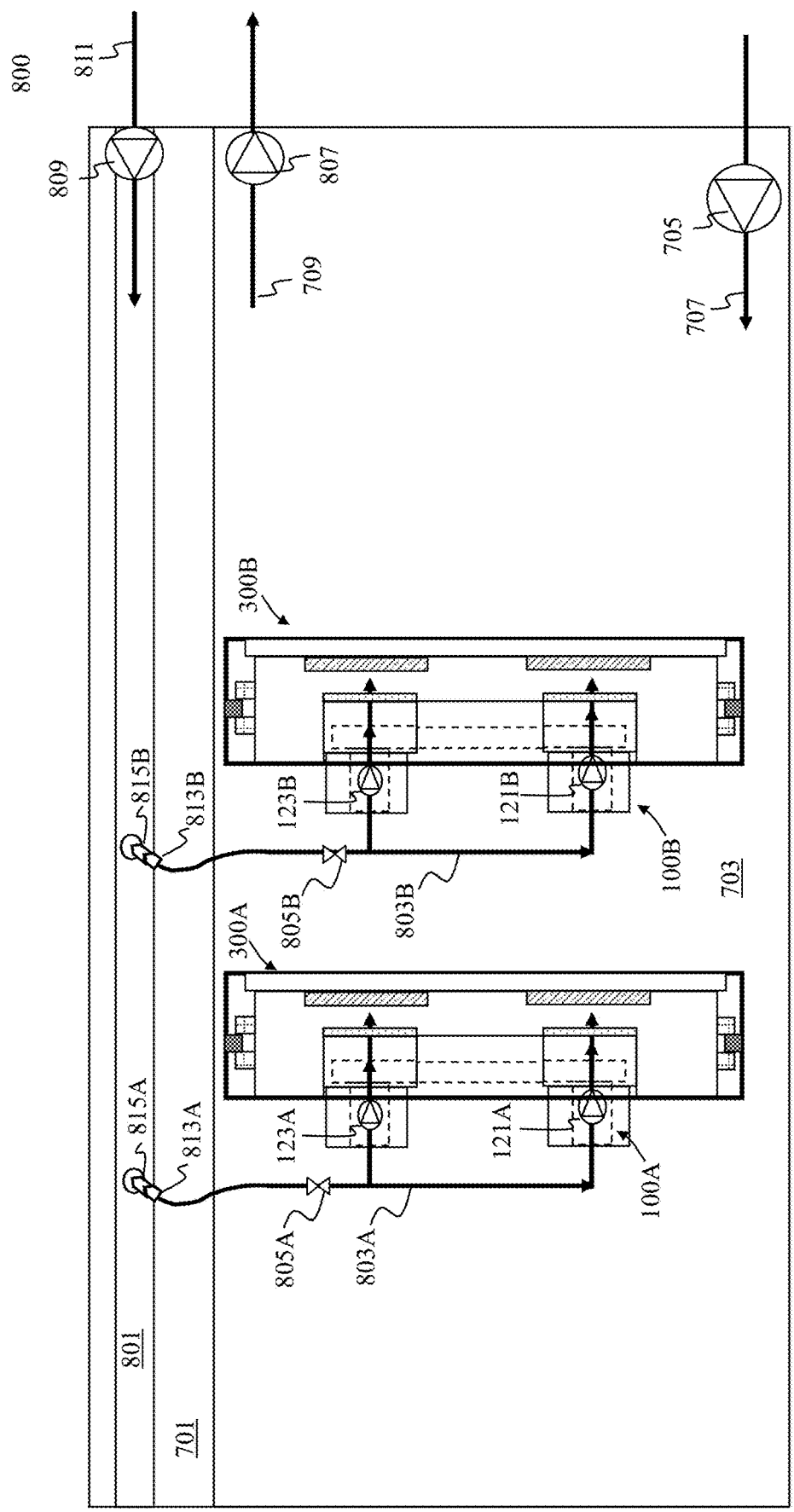
FIG. 8 is a block diagram illustrating a cooling system having cooling modules coupled to a fluid loop, the cooling modules and servers are submerged in an immersion environment according to one embodiment.

FIG. 8 is a block diagram illustrating a cooling system 800 having cooling modules 100A-100B coupled to fluid loops 803A-803B. Cooling modules 100A-100B and respective server chassis 300A-300B are submerged in an immersion environment according to one embodiment. As shown, cooling system 800 can include cooling modules 100A-100B housed in server chassis 300A-300B. Cooling modules 100A-100B can include pumps 121A-123A, 121B-123B having the pump suction side fluidly couple to respective fluid loops 803A-803B to receive a coolant fluid.

In one embodiment, cooling system 800 includes fluid loops 803A-803B having various connectors, fluid lines, valves, interfaces, and so on. For example, fluid loops 803A-803B includes valves 805A and 805B. In one embodiment, a supply temperature of server electronics in respective cooling modules 100A-100B can be used to control corresponding valves 805A and 805B, where the valve open ratio controls a flow rate of cooling liquid to the respective cooling modules 100A-100B. In one embodiment, the ends of fluid loop 803A-803B are coupled with connectors 813A, 813B. Connectors 813A, 813B can interface with complementary connectors 815A, 815B that are coupled to coolant distributor 801.

In one embodiment, cooling system 800 includes coolant distributor 801 equipped on immersion unit 701. Coolant distributor 801 can distribute a coolant fluid to the cooling modules 100A-100B. Coolant distributor 801 can include liquid manifold, pipes, tubes, or hoses, and so forth. In one embodiment, coolant distributor 801 can include pump 809 and the pump 809 can include an inlet 811 to receive a coolant fluid to the distributor 801.

In one embodiment, pump 807 is disposed at outlet line 709 and pump 807 can be used for the total fluid return from immersion unit 701. The overall immersion system can have immersion fluid 703 that can be circulated by pump 705. Here, cooling system can be viewed as having two separate cooling streams, a first stream being the immersion fluid 703 circulated by pump 705, and a second stream being the coolant fluid distributed by coolant distributor 801 as jets of coolant fluid that are direct at the dedicated areas (hot spots) on the surface of the high power density electronics/chips within server chassis 300A-300B. Although each of cooling modules 100A-100B are shown with two, cooling modules 100A-100B can include any number of cooling plates/injection plates to cool all or a subset of chips of the server boards.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A cooling module, comprising:
   a first cooling plate having a first internal channel;
   a second cooling plate having a second internal channel;
   an interconnect frame coupled in between the first and second cooling plates, the interconnect frame includes a third internal channel that connects the first internal channel to the second internal channel; and
   a first injection plate attached to a bottom portion of the first cooling plate and a second injection plate attached to a bottom portion of the second cooling plate, the first and second injection plates manage a distribution of coolant fluid to dedicated areas of electronic chips adjacent to the corresponding first and second injection plates.

2. The cooling module of claim 1, wherein the coolant fluid at the first internal channel enters the second internal channel via the third internal channel and the coolant fluid is accelerated by the first and second injection plates to the dedicated areas of the electronic chips.

3. The cooling module of claim 1, wherein the second cooling plate is arranged in a series manner or a parallel manner with the first cooling plate and coolant fluid enters the first internal channel subsequent to entering the second internal channel.

4. The cooling module of claim 1, further comprising:
   a first pump frame coupled to an inlet port at the first cooling plate; and
   a first pump disposed at the first pump frame to directly intake a coolant fluid from the first pump to the first internal channel of the first cooling plate.

5. The cooling module of claim 4, wherein the first pump generates a localized acceleration of cooling stream within an immersion environment.

6. The cooling module of claim 4, wherein the first pump is situated to a side of the first cooling plate or the first pump is situated near a top portion of the first cooling plate.

7. The cooling module of claim 4, wherein the first pump frame is open-ended to an immersion fluid to directly receive the immersion fluid as the coolant fluid or the first pump frame is coupled to a distribution line to receive the coolant fluid that is different from the immersion fluid.

8. The cooling module of claim 7, wherein when the first pump frame is coupled to the distribution line to receive the coolant fluid that is different from the immersion fluid, the distribution line comprises a distribution pump to distribute coolant fluid to the first pump frame.

9. The cooling module of claim 1, wherein the first or second injection plates comprises a plurality of injection ports or plates forming an injection pattern that injects coolant fluid at locations with flow rates based on locations and sizes of the plurality of injection ports.

10. The cooling module of claim 1, wherein the first or second injection plates are configured nearby a first subset of electronics with workload intensity above a threshold but not near a second subset of electronics with workload intensity below a threshold.

11. The cooling module of claim 1, further comprising:
    a second pump frame coupled to an inlet port at the second cooling plate; and
    a second pump disposed at the second pump frame to pump a same coolant fluid from the second pump to the second internal channel of the second cooling plate, wherein the first and/or second pumps operate in redundant mode.

12. The cooling module of claim 1, further comprising a mounting structure secured to the first and second cooling plates, wherein the mounting structure is mounted to a server chassis to position the first and second injection plates near the dedicated areas of the electronic chips.

13. A server, comprising:
    a chassis frame housing a server board having a plurality of electronic chips that are submersible in an immersion environment;
    a perforation region at an end of a server chassis for an immersion fluid to enter or exit the immersion environment; and
    a cooling module contained within the chassis frame, the cooling module comprises:
      a first cooling plate having a first internal channel;
      a second cooling plate having a second internal channel;
      an interconnect frame coupled in between the first and second cooling plates, the interconnect frame includes a third internal channel that connects to the first and second internal channels; and
      a first injection plate attached to a bottom portion of the first cooling plate and a second injection plate attached to a bottom portion of the second cooling plate, the first and second injection plates manage a distribution of coolant fluid to dedicated areas of electronic chips adjacent to the corresponding first and second injection plates.

14. The server of claim 13, wherein the coolant fluid at the first internal channel enters the second internal channel via the third internal channel and the coolant fluid is accelerated by the first and second injection plates to the dedicated areas of the electronic chips.

15. The server of claim 13, wherein the second cooling plate is arranged in a series manner or a parallel manner with the first cooling plate and coolant fluid enters the first internal channel subsequent to entering the second internal channel.

16. The server of claim 13, wherein the cooling module further comprises:
    a first pump frame coupled to an inlet port at the first cooling plate; and
    a first pump disposed at the first pump frame to directly intake a coolant fluid from the first pump to the first internal channel of the first cooling plate.

17. The server of claim 16, wherein the first pump generates a localized acceleration of cooling stream within an immersion environment.

18. The server of claim 16, wherein the first pump is situated to a side of the first cooling plate or the first pump is situated near a top portion of the first cooling plate.

19. The server of claim 16, wherein the first pump frame is open-ended to an immersion fluid to directly receive the immersion fluid as the coolant fluid or the first pump frame is coupled to a distribution line to receive the coolant fluid that is different from the immersion fluid.

20. A cooling system, comprising:
an immersion unit; and
a server submersible in the immersion unit, the server, comprising:
- a chassis frame housing a server board having a plurality of electronic chips that are submersible in an immersion environment;
- a perforation region at an end of the server for an immersion fluid to enter or exit the immersion environment; and
- a cooling module contained within the chassis frame, the cooling module comprises:
  - a first cooling plate having a first internal channel;
  - a second cooling plate having a second internal channel;
  - an interconnect frame coupled in between the first and second cooling plates, the interconnect frame includes a third internal channel that connects to the first and second internal channels; and
  - a first injection plate attached to a bottom portion of the first cooling plate and a second injection plate attached to a bottom portion of the second cooling plate, the first and second injection plates manage a distribution of coolant fluid to dedicated areas of electronic chips adjacent to the corresponding first and second injection plates.

* * * * *